(12) United States Patent
Komatsu et al.

(10) Patent No.: US 8,290,451 B2
(45) Date of Patent: Oct. 16, 2012

(54) NOISE REDUCTION CIRCUIT FOR CANCELING LEAKAGE SIGNAL

(75) Inventors: Naoki Komatsu, Osaka (JP); Hideki Iwaki, Osaka (JP); Toru Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 952 days.

(21) Appl. No.: 12/295,480

(22) PCT Filed: Mar. 28, 2007

(86) PCT No.: PCT/JP2007/056545
§ 371 (c)(1),
(2), (4) Date: Jan. 9, 2009

(87) PCT Pub. No.: WO2007/114126
PCT Pub. Date: Oct. 11, 2007

(65) Prior Publication Data
US 2009/0174476 A1    Jul. 9, 2009

(30) Foreign Application Priority Data

Mar. 31, 2006 (JP) .................................. 2006-098811

(51) Int. Cl.
*H04B 1/04* (2006.01)
(52) U.S. Cl. ......... 455/114.2; 455/82; 455/85; 455/296; 327/310
(58) Field of Classification Search ................ 455/114.2
See application file for complete search history.

(56) References Cited

U.S. PATENT DOCUMENTS

| 3,825,815 | A |   | 7/1974 | Gyugyi et al. |
| 3,969,637 | A | * | 7/1976 | Minami et al. ................ 327/310 |
| 5,233,318 | A | * | 8/1993 | Sasaki et al. .................. 333/109 |
| 6,124,767 | A | * | 9/2000 | Woods ....................... 331/117 D |
| 6,567,649 | B2 | * | 5/2003 | Souissi ........................... 455/83 |
| 7,521,890 | B2 | * | 4/2009 | Lee et al. ..................... 320/108 |

FOREIGN PATENT DOCUMENTS

| EP | 0 596 562 | 5/1994 |
| JP | 59-107615 | 6/1984 |
| JP | 08-088936 | 4/1996 |
| JP | 2003-158238 | 5/2003 |
| JP | 2004-140210 | 5/2004 |

OTHER PUBLICATIONS

Supplementary European Search Report (in English language) issued Nov. 13, 2009 in European Patent Application No. 07 73 9983.
International Search Report issued Jun. 26, 2007 in the International (PCT) Application of which the present application is the U.S. National Stage.

* cited by examiner

*Primary Examiner* — Duc Nguyen
*Assistant Examiner* — Ajibola Akinyemi
(74) *Attorney, Agent, or Firm* — Wenderoth, Lind & Ponack, L.L.P.

(57) ABSTRACT

In a noise reduction circuit, a transistor circuit amplifies an input signal and outputs an output signal with supply of power from the DC voltage source via a power supply line circuit. The canceling signal adding circuit acquires and attenuates a part of the output signal, to generate a canceling signal having a phase substantially opposite to a phase of a leakage signal leaking to the power supply line circuit, and having an amplitude substantially the same as an amplitude of the leakage signal.

9 Claims, 8 Drawing Sheets

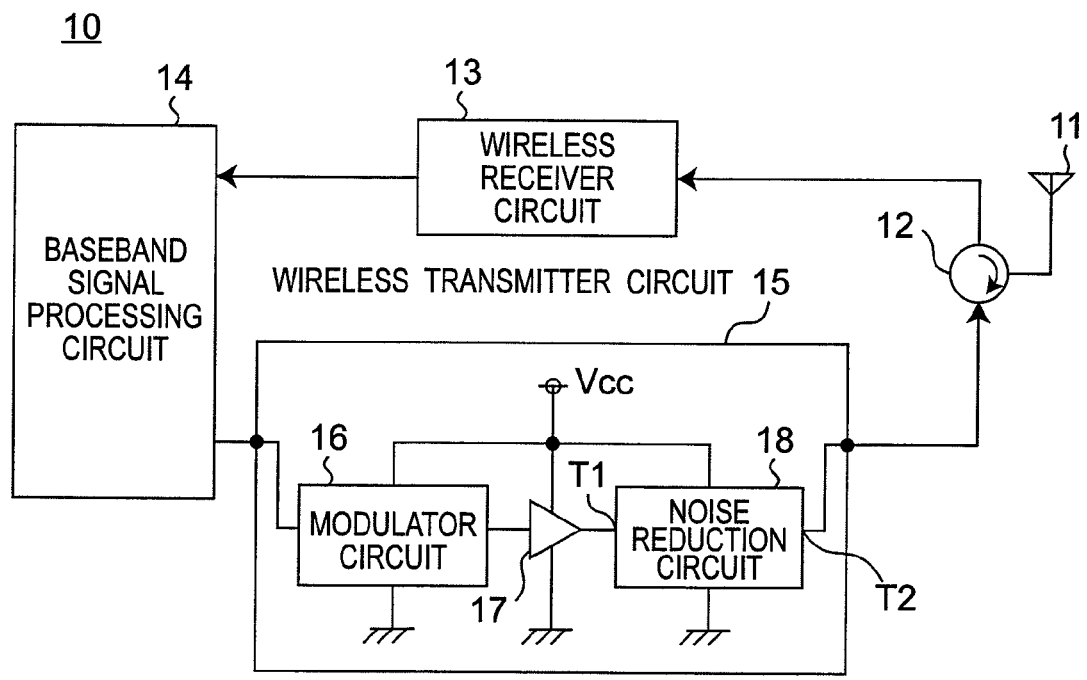
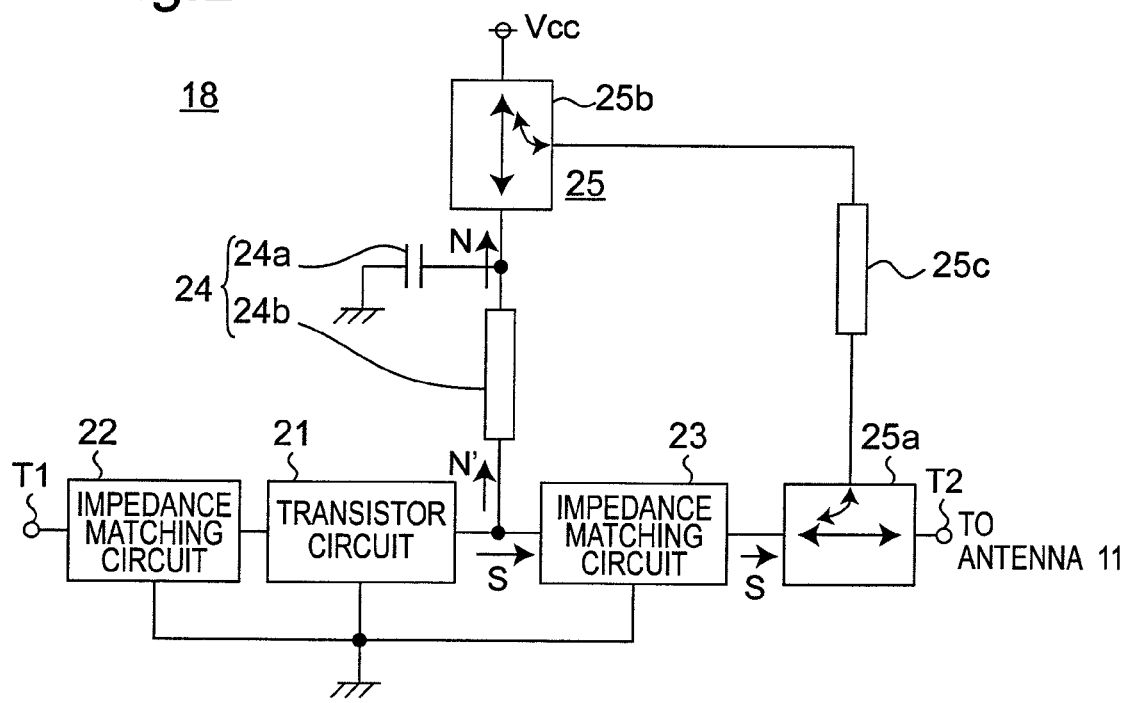

NOISE REDUCTION CIRCUIT FOR CANCELING LEAKAGE SIGNAL

TECHNICAL FIELD

The present invention relates to a noise reduction circuit and method for use in wireless communication apparatuses such as mobile telephones and wireless communication terminals, and to a signal amplifier and a wireless communication apparatus each employing the same noise reduction circuit.

BACKGROUND ART

Electronic devices such as mobile telephones are generally provided with circuits each realizing various functions with an AC (alternating current) signal with supply of a power from a DC (direct current) power supply. Such a circuit operates under such an assumption that a reference electric potential of a specified portion is constant, and performs transmission, amplification and so on of signals by adding the AC signal to the reference electric potential. Accordingly, when an unexpected noise is superimposed on the reference electric potential, the operations of the circuit become unstable. Such a method (See Patent Document 1, for example) is known for suppressing fluctuations of the reference electric potential that a positive phase output and a negative phase output are generated by an operational amplifier and superimposed on the reference electric potential.

In addition, a semiconductor integrated circuit apparatus is disclosed which can reduce crosstalk due to induction without arranging many extra circuit elements (See Patent Document 2, for example). In the semiconductor integrated circuit apparatus, a plurality of parallel wiring portions are formed in a part of a signal path so that directions of signal flowing through the parallel wiring portions are mutually reversed. Each of the parallel wiring portion does not include any inverters at the halfway thereof, and the portion is a part of a real wiring, and therefore, it is not necessary to employ any extra circuit elements. When a signal is transmitted from one end the parallel wiring portion, the signal is folded back partway and the signal propagation direction is reversed at the portion. When the directions of currents flowing through the parallel conductors are reversed to each other, magnetic fields in different directions are canceled due to the nature of electromagnetism, and the generation of electromagnetic waves is suppressed. The parallel wiring portions can ease and further suppress the crosstalk with the other neighborhood wiring.

Patent Document 1: Japanese patent laid-open publication No. JP-59-107615-A.
Patent Document 2: Japanese patent laid-open publication No. JP-2003-158238-A.

SUMMARY OF THE INVENTION

Problems to be Solved by the Invention

In the recent electronic devices such as portable phones, reductions in size thereof and power consumption thereof have been promoted, and the influence of even an extremely weak leakage signal has become unignorable. Namely, since an internal mounting density on a substrate is increased in a compact electronic device, the influence of the weak leakage signal has been relatively increased as compared with that of a circuit having a smaller mounting density. In addition, the reduction in the power consumption leads to a lowered application voltage of the DC voltage source and a lowered reference electric potential with respect to a ground, and the influence of the weak leakage signal on the reference electric potential is relatively increased.

In particular, in the wireless communication apparatus such as a mobile telephone, a transmission signal is amplified to a power required for the wireless communication by an amplifier circuit provided in an extremely small housing. However, the output signal of the amplifier circuit is the AC signal of the largest power in the housing, and it is concerned that the output signal might leak to a power supply line circuit to become an interference signal to the other devices and circuits.

In the Patent Document 1, it is possible to suppress the fluctuations in the reference electric potential, however, it is impossible to adopt the method of the Patent Document 1 for the recent electronic devices in which the reduction in the power consumption has been promoted, because the negative phase output of the operational amplifier is utilized to suppress the fluctuations. In addition, many parts are required such as parts for constituting an operational amplifier and components for adjusting an output electric potential, and therefore, it is still impossible to adopt the method of the Patent Document 1 for the recent electronic device in which the size reduction has been promoted.

Further, supposing the application of the method of the Patent Document 1, it is necessary to provide an inverting amplifier having high linearity which does not influence a signal amplified at the previous stage of the same inverting amplifier, and therefore, it is impractical to incorporate the method into a circuit for the purpose of canceling the extremely weak signal. Further, paying attention to a signal leaking to the power supply line circuit of the amplifier, a power supply line circuit is required for the inverting amplifier in the Patent Document 1, and the power supply line circuit of the inverting amplifier conversely becomes a noise source in spite of the intention of suppressing the noise by the inverting amplifier. For the above reasons, the weak leakage signal could not be suppressed by the methods of the above documents.

It is an object of the present invention is to provide a noise reduction circuit and method, and a signal amplifier and a wireless communication apparatus each employing the same noise reduction circuit, each capable of solving the above problems and of reducing a noise by a simple configuration and without preventing the reductions in size and power consumption.

Means for Solving the Problems

According to the first aspect of the present invention, a noise reduction circuit has signal amplifying means and signal adding means. The signal amplifying means amplifies an input signal and outputs an output signal with supply of power from a power source via a power supply line circuit. The signal adding means acquires and attenuates a part of the output signal from the signal amplifying means, to generate a canceling signal having a phase substantially opposite to a phase of a leakage signal leaking to the power supply line circuit, and having an amplitude substantially the same as an amplitude of the leakage signal.

In the above mentioned noise reduction circuit, the signal adding means is preferably a passive circuit having a plurality of passive elements.

In addition, in the above mentioned noise reduction circuit, the signal adding means preferably add the canceling signal to the leakage signal by using a coupler having one pair of transmission lines formed in the vicinity of each other so as to be electromagnetically coupled to each other.

Further, the above mentioned noise reduction circuit preferably has a low-impedance part for substantially shorting a line of the leakage signal with a ground to ground the leakage signal at a frequency of the leakage signal, and a high-impedance part for setting a connection point between the low-impedance part and the signal amplifying means to a substantially open-circuited state at the frequency of the leakage signal. In this case, the signal adding means adds the leakage signal to the leakage signal at a position which is closer to the power source than the low-impedance part.

In this case, the high-impedance part is preferably a transmission line having a length of a quarter of a wavelength of the leakage signal, and the low-impedance part is a capacitor for passing therethrough a signal having the frequency of the leakage signal.

Further, in the above mentioned noise reduction circuit, the signal adding means is preferably formed on a substrate on which the signal amplifying means is mounted.

According to the second aspect of the present invention, a signal amplifier have the above-mentioned noise reduction circuit, and the signal amplifier has a power terminal connected to the power supply line circuit, and an output terminal for outputting the output signal.

According to the third aspect of the present invention, a wireless communication apparatus has the above-mentioned noise reduction circuit, and the wireless communication apparatus has transmitter means for transmitting the signal amplified by the signal amplifying means.

According to the fourth aspect of the present invention, in a wireless communication apparatus having receiver means for receiving a wireless signal having a predetermined frequency, the wireless communication apparatus has the above-mentioned noise reduction circuit, the input signal is a square wave signal, and the power supply line circuit attenuates a leakage signal which is a part of frequency components of the square wave signal, at one of (a) a frequency of a wireless signal used in the wireless communication apparatus, (b) an intermediate frequency related to the wireless signal, and (c) a frequency of a baseband signal.

According to the fifth aspect of the present invention, a noise reduction method includes the steps of amplifying an input signal and outputting an output signal with supply of power from a power source via a power supply line circuit, and acquiring and attenuating a part of the output signal, to generate a canceling signal having a phase substantially opposite to a phase of a leakage signal leaking to the power supply line circuit, and having an amplitude substantially the same as an amplitude of the leakage signal.

Effects of the Invention

According to the noise reduction circuit and method of the present invention, by amplifying an input signal and outputting an output signal with supply of power from a power source via a power supply line circuit, and acquiring and attenuating a part of the output signal, a canceling signal is generated that has a phase substantially opposite to a phase of a leakage signal and has an amplitude substantially the same as an amplitude of the leakage signal. In this case, the leaking signal leaks to the power supply line circuit. This leads to a remarkably and effectively reduced noise by a simple configuration and without preventing the reductions in size and power consumption.

BRIEF DESCRIPTION OF THE DRAWINGS

FIG. 1 is a block diagram showing a configuration of a wireless communication circuit of a mobile telephone according to a first preferred embodiment of the present invention;

FIG. 2 is a block diagram showing a detailed configuration of a noise reduction circuit 18 of FIG. 1;

DESCRIPTION OF REFERENCE SYMBOLS

Figure 3:
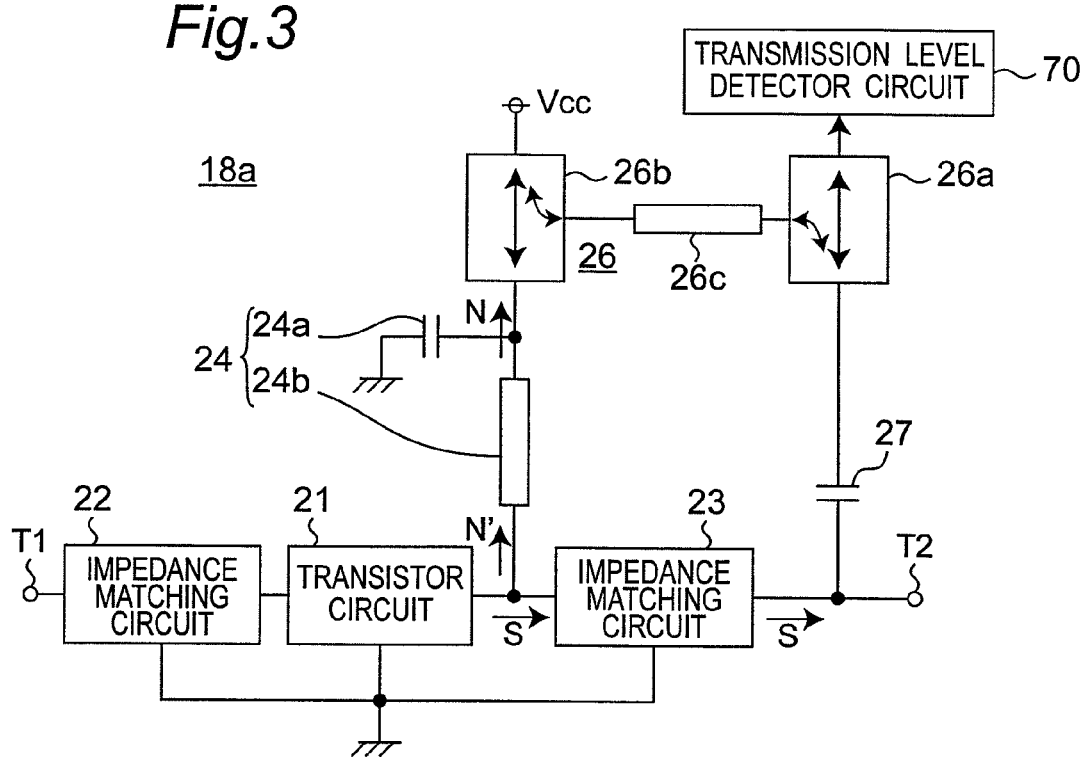
FIG. 3 is a block diagram showing a detailed configuration of a noise reduction circuit 18a according to a second preferred embodiment of the present invention.

10 . . . Mobile telephone,
11 . . . Antenna,
12 . . . Circulator,
13 . . . Wireless receiver circuit, 14 . . . Baseband signal processing circuit,
15 . . . Wireless transmitter circuit,
16 . . . Modulator circuit,
17 . . . Driver circuit,
18 . . . Noise reduction circuit,
21 . . . Transistor circuit,
22 and 23 . . . Impedance matching circuit,
24 . . . Power supply line circuit,
24a . . . Bypass capacitor,
24b . . . Transmission line,
25 and 26 . . . Canceling signal adding circuit,
25a, 25b, 26a and 26b . . . Coupler,
25c and 26c . . . Signal line,
27 . . . Capacitor,
28 and 29 . . . Canceling signal adding circuit,
28A, 29A and 29B . . . Coupler,
28a, 28b, 28c, 28d, 29a, 29b, 29c, 29d and 29e: Transmission line,
28as and 28bs . . . Strip conductor,
70 . . . Transmission level detector circuit,
80 . . . Through hole conductor,
110 . . . Printed circuit board,
110A . . . Semiconductor substrate,
111 . . . Ground conductor,
112 . . . Dielectric layer,
121, 122, 123 and 124 . . . Strip conductor,
121A, 122A, 123A and 124A . . . Microstrip line,
125 . . . Signal amplifier IC,
125a . . . Power terminal,
125b . . . Signal output terminal, and
126 and 127 . . . Capacitor.

DETAILED DESCRIPTION OF THE INVENTION

Preferred embodiments according to the present invention will be described below with reference to the drawings. Components similar to each other are denoted by the same reference numerals.

First Preferred Embodiment

FIG. 1 is a block diagram showing a configuration of a wireless communication circuit of a mobile telephone according to the first preferred embodiment of the present invention. FIG. 1 shows a circuit mainly for transmission and receiving of a wireless signal. In order to transmit and receive the wireless signal, a mobile telephone 10 is configured by including an antenna 11, a circulator 12, a wireless receiver circuit 13, a baseband signal processing circuit 14, and a wireless transmitter circuit 15. In the mobile telephone 10, during the receiving, the wireless signal received via the antenna 11 is inputted to the wireless receiver circuit 13 via the circulator 13, and the wireless receiver circuit 13 executes processings such as frequency conversion to lower frequency and demodulation on the received wireless signal, and outputs the demodulated baseband signal to the baseband signal processing circuit 14. Based on the inputted demodulated signal, the baseband signal processing circuit 14 executes audio outputting, data processings and so on.

The wireless transmitter circuit 15 is configured by including a modulator circuit 16, a driver circuit 17 and a noise reduction circuit 18, and these circuits 16, 17 and 18 are driven by a DC voltage Vcc of a DC voltage source. In the mobile telephone 10, during the transmission, a baseband signal processed by the baseband signal processing circuit 14 is inputted to the wireless transmitter circuit 15. The modulator circuit 16 in the wireless transmitter circuit 15 modulates a predetermined carrier wave according to the inputted baseband signal to generate a modulated wireless signal. The modulated wireless signal is outputted to the antenna 11 via the driver circuit 17, the noise reduction circuit 18 and the circulator 12, and transmitted from the antenna 11.

As shown in FIG. 2, the noise reduction circuit 18 includes a transistor circuit 21 which functions as a power amplifier, and a canceling signal adding circuit 25 which reduces a noise. The latter canceling signal adding circuit 25 acquires a part of an output signal from the transistor circuit 21 and attenuates the same signal. At this time, the canceling signal adding circuit 25 generates a canceling signal having a phase substantially opposite to a phase of an output signal leaking to the power supply line circuit of the transistor circuit 21, and having an amplitude substantially the same as an amplitude of the leaking output signal. Then, the canceling signal adding circuit 25 adds the canceling signal to the output signal leaking to the power supply line circuit. Accordingly, it is possible to suppress the noise leaking from the noise reduction circuit 18 to the DC voltage source side.

FIG. 2 is a block diagram showing a detailed configuration of the noise reduction circuit 18 of FIG. 1. Referring to FIG. 2, the noise reduction circuit 18 is configured by including a transistor circuit 21, impedance matching circuits 22 and 23, a power supply line circuit 24, and a canceling signal adding circuit 25. In this example, the power supply line circuit 24 includes a bypass capacitor 24a and a transmission line 24b. In addition, the power supply line circuit 24 is provided so as to extend in a opposite direction to the transistor circuit 21 when seen from the bypass capacitor 24a, and the power supply line circuit 24 is connected to the DC voltage source Vcc via the coupler 25b of the canceling signal adding circuit 25.

The transistor circuit 21 is an amplifier circuit that inputs and amplifies the wireless signal outputted from the driver circuit 17 and amplifies the signal, and the amplified transmitting wireless signal S becomes a transmitting wireless signal transmitted from the antenna 11. On the input side of the transistor circuit 21, there is provided the impedance matching circuit 22 for suppressing the loss of the wireless signal from the driver circuit 17 by matching an output impedance of the driver circuit 17 with an input impedance of the transistor circuit 21. On the other hand, on the output side of the transistor circuit 21, there is provided the impedance matching circuit 23 for suppressing the loss of the wireless signal to be transmitted, by matching an output impedance of the transistor circuit 21 with an output impedance when the antenna 11 is seen via a coupler 25a. The transistor circuit 21 and the impedance matching circuits 22 and 23 are constituted so that previously set amplification and matching are performed within a frequency band of the transmitting wireless signal S of the transistor circuit 21.

In addition, the power supply line circuit 24 is connected to the transistor circuit 21, and an electric power is supplied from the DC voltage source Vcc to the transistor circuit 21 via the power supply line circuit 24. In order to suppress a leakage signal from the transistor circuit 21, in the power supply line circuit 24, the transmission line 24b and the bypass capacitor 24a are connected between the transistor circuit 21 and the DC voltage source Vcc in this order from the transistor circuit 21. In this case, one end of the bypass capacitor 24a is connected to the output terminal of the transistor circuit 21, and the other end of the bypass capacitor 24a is connected to a ground conductor (e.g., a ground conductor 111 of FIG. 9 described later). The bypass capacitor 24a substantially shorts a line for a signal within a frequency band of the transmitting wireless signal S with the ground to ground the same signal. With this arrangement, the bypass capacitor 24a forms a low-impedance part having a relatively low impedance in the above frequency band.

In addition, the transmission line 24b for phase adjustment is set so as to become a transmission line having a length of a quarter of a wavelength of a signal in the frequency band of the transmitting wireless signal S between the bypass capacitor 24a and the transistor circuit 21. Accordingly, the power supply line circuit 24 is set to a substantially open-circuited state at the signal in the frequency band of the transmitting wireless signal S, and forms a high-impedance part having a relatively high impedance. Accordingly, a large part of the transmitting wireless signal S of the transistor circuit 21 is transmitted to the impedance matching circuit 23, and a part of the same signal is transmitted as a leakage signal N' to the power supply line circuit 24 side.

A large part of the leakage signal N' flows to the ground conductor by the effect of the bypass capacitor 24a, however, a part of the leakage signal N' is transmitted to the DC voltage source Vcc by the power supply line circuit 24. Accordingly, when no measure is taken, an output signal (referred to as a leakage signal N hereinafter) would be generated that leaks from the transmission line 24b to the DC voltage source Vcc side. However, since the reductions in size and power consumption are promoted in the mobile telephone 10 according to the present preferred embodiment, even a weak leakage signal N cannot be ignored.

Accordingly, in the present preferred embodiment, the leakage signal N is canceled by the canceling signal adding circuit 25 by using a part of the transmitting wireless signal S as follows. The canceling signal adding circuit 25 is a passive circuit configured by including the couplers 25a and 25b, and a signal line 25c. Referring to FIG. 2, the coupler 25a is configured by including a transmission line between the impedance matching circuit 23 and the antenna 11, and a further transmission line formed in the vicinity of the above transmission line so as to be electromagnetically coupled to the above transmission line. The coupler 25a acquires a part of the transmitting wireless signal S outputted from the impedance matching circuit 23, and outputs the acquired signal to the coupler 25b via the signal line 25c.

In addition, the coupler 25b is configured by including a transmission line provided between the bypass capacitor 24a and the DC voltage source Vcc, and a further transmission line formed in the vicinity of the above transmission line so as to be electromagnetically coupled to the above transmission line. In this case, a line length and a characteristic impedance of the power supply line circuit 24 and the line lengths and the characteristic impedances of the impedance matching circuit 23 and the signal line 25c of the canceling signal adding circuit 25 are previously adjusted, so that the signal which is a part of the transmitting wireless signal S inputted from the coupler 25a to the coupler 25b via the signal line 25c has a phase substantially opposite to a phase of the leakage signal N inputted from the power supply line circuit 24 to the coupler 25b and has an amplitude substantially the same as an amplitude of the same leakage signal N. Accordingly, the coupler 25b of the canceling signal adding circuit 25 adds the signal which is a part of the transmitting wireless signal S acquired by the coupler 25a to the leakage signal N inputted from the power supply line circuit 24 to the coupler 25b, to suppress the leakage signal N and not to transmit the leakage signal N to the DC voltage source Vcc side.

In addition, since a signal which is a signal source of the leakage signal N is the transmitting wireless signal S in the present preferred embodiment, the frequency bands of the transmitting wireless signal S and the leakage signal N become the same as each other. In addition, when the transmitting wireless signal S of a certain frequency is outputted, the leakage signal N has a frequency substantially identical to that of the transmitting wireless signal S. Accordingly, by configuring the canceling signal adding circuit 25 of the passive circuit which can adjust the phase and the amplitude, it is easily possible to add a signal for canceling the leakage signal N to the power supply line circuit 24.

Further, the transmitting wireless signal S is the signal amplified by the transistor circuit 21, and the leakage signal N is the signal acquired by further attenuating the leakage signal N' leaking to the power supply line circuit 24. Accordingly, a power of the leakage signal N is much smaller than a power of the transmitting wireless signal S, and the canceling signal for canceling the leakage signal N can be generated by attenuating the power of the transmitting wireless signal S by the canceling signal adding circuit 25. Accordingly, no additional power consumption of an amplifier and the like is required for canceling the leakage signal N, and the canceling of the leakage signal N can be achieved extremely simply by the passive circuit.

In the present preferred embodiment, the transmission line connected to the signal line 25c of the coupler 25b is formed in the vicinity of the transmission line between the bypass capacitor 24a and the DC voltage source Vcc so that the two transmission lines are electromagnetically coupled to each other Accordingly, the leakage signal N can be canceled without influencing the impedance when the power supply line circuit 24 is seen from the output terminal of the transistor circuit 21.

For example, when the transmission line of the coupler 25b is connected to the connection point of the bypass capacitor 24a and the transmission line 24b, the impedance seen from the transistor circuit 21 to the power supply line circuit 24 side fluctuates, and it is concerned that the leakage signal N' leaking from the transistor circuit 21 to the power supply line circuit 24 might increase. However, in the present preferred embodiment, the coupler 25b is connected between the bypass capacitor 24a and the DC voltage source Vcc, and there is provided the power supply line circuit 24 including the bypass capacitor 24a and the transmission line 24b having a line length of a quarter wavelength. Accordingly, the leakage signal N can be further canceled while keeping the mechanism for suppressing the leakage of the leakage signal N to the power supply line circuit 24.

In addition, by connecting the coupler 25b between the bypass capacitor 24a and the DC voltage source Vcc, it is possible to determine the configurations of the couplers 25b and 25a of the canceling signal adding circuit 25 and so on without considering the impedance seen from the bypass capacitor 24a to the transistor circuit 21. Namely, in the canceling signal adding circuit 25, it becomes possible to determine the circuit configuration thereof with paying attention only to the phase and the amplitude of the leakage signal N, and it is possible to design the canceling signal adding circuit 25 with an extremely high degree of freedom.

As described above, the configuration that can be designed with a high degree of freedom is especially important in the mobile telephone 10 whose size reduction is promoted. Namely, the substrate and so on provided in the mobile telephone 10 are compact, and therefore, once the parts other than the canceling signal adding circuit 25 are determined, it is not easy to change the arrangements and so on of the components. However, when the design freedom of the canceling signal adding circuit 25 is high, it is easy to constitute the canceling signal adding circuit 25 without modifying the parts other than the canceling signal adding circuit 25. Accordingly, the present invention can be easily applied to even compact electronic devices.

Second Preferred Embodiment

The preferred embodiment of the present invention is only required to generate a signal for canceling the noise by acquiring and attenuating a part of the amplified transmitting wireless signal S, and a variety of configurations can be adopted besides the foregoing preferred embodiment. FIG. 3 is a block diagram showing a detailed configuration of a noise reduction circuit 18a maccording to the second preferred embodiment of the present invention. The noise reduction circuit 18a of FIG. 3 is characterized by including a canceling signal adding circuit 26 instead of the canceling signal adding circuit 25 of FIG. 2 as compared with the noise reduction circuit 18 of FIG. 2. Referring to FIG. 3, the canceling signal adding circuit 26 is configured by including a capacitor 27, couplers 26a and 26b, and a signal line 26c. Namely, such a configuration is adopted in which a part of the transmitting wireless signal S is acquired by using the coupler 26a including a transmission line to a transmission level detector circuit 70. The configuration of FIG. 3 is described with regard to only the points different from those of FIG. 2.

Referring to FIG. 3, the output terminal of the impedance matching circuit 23 is connected to the transmission level detector circuit 70 via the capacitor 27 and the coupler 26a, and a part of the transmitting wireless signal S outputted from the impedance matching circuit 23 is supplied to a detector provided in the transmission level detector circuit 70, and is utilized for level detection of the transmitting wireless signal S.

Accordingly, in the present preferred embodiment, the canceling signal adding circuit 26 is configured by a passive circuit. The coupler 26a of the canceling signal adding circuit 26 has the transmission line provided between the capacitor 27 and the transmission level detector circuit 70, and a transmission line formed in the vicinity of the above transmission line so as to be electromagnetically coupled to the above transmission line. The latter transmission line is connected to the coupler 26b via the signal line 26c. Accordingly, a part of the transmitting wireless signal S transmitted from the capacitor 27 to the transmission level detector circuit 70 is acquired by the coupler 26a, and thereafter, transmitted to the coupler 26b via the signal line 26c.

In addition, the coupler 26b of the canceling signal adding circuit 26 is configured by including the transmission line provided between the bypass capacitor 24a and the DC voltage Vcc, and a transmission line formed in the vicinity of the above transmission line so as to be electromagnetically coupled to the above transmission line. The coupler 26b cancels the leakage signal N so that the same signal is reduced, by adding a part of the transmitting wireless signal S acquired by the coupler 26a to the leakage signal N. Namely, the line length and the characteristic impedance of the power supply line circuit 24 and the line lengths and the characteristic impedances of the impedance matching circuit 23, the coupler 26a and the signal line 26c are previously adjusted, so that a signal, which is a part of the transmitting wireless signal S inputted from the coupler 26a to the coupler 26b via the signal line 26c, has a phase substantially opposite to a phase of the leakage signal N inputted from the power supply line circuit 24 to the coupler 26b, and has an amplitude substantially the same as an amplitude of the leakage signal N. Accordingly, the coupler 26b of the canceling signal adding circuit 26 adds the signal a part of the transmitting wireless signal S acquired by the coupler 26a to the leakage signal N inputted from the power supply line circuit 24 to the coupler 26b, and therefore, the leakage signal N is suppressed and not transmitted to the DC voltage source Vcc side.

Also in the present preferred embodiment, in a manner similar to that of the above described preferred embodiment, the canceling signal can be easily added to the leakage signal N by the canceling signal adding circuit 26 of the passive circuit. In addition, no additional power consumption of an amplifier and the like is required for canceling the leakage signal N, and the canceling of the leakage signal N can be achieved extremely simply by the passive circuit.

Further, it is possible to further supply electric power for canceling the leakage signal. In this case, such a mechanism is kept for suppressing the leakage of the leakage signal N to the power supply line circuit 24 by the power supply line circuit 24 including the bypass capacitor 24a and the transmission line 24b having a line length of a quarter wavelength. This configuration makes it possible to design the canceling signal adding circuit 26 with an extremely high degree of freedom. It becomes possible to constitute the canceling signal adding circuits of a variety of circuits due to the high design freedom of the canceling signal adding circuit, and it becomes possible to adopt a variety of configurations as shown in FIGS. 2 and 3.

Third Preferred Embodiment

Figure 4:
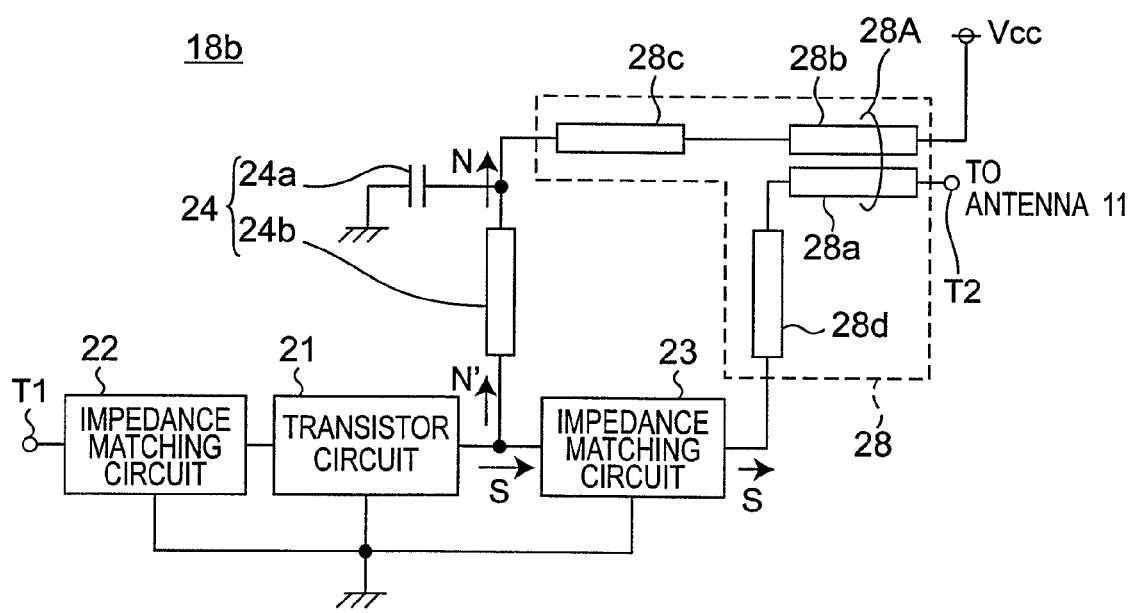
FIG. 4 is a block diagram showing a detailed configuration of a noise reduction circuit 18b according to a third preferred embodiment of the present invention.

FIG. 4 is a block diagram showing a detailed configuration of a noise reduction circuit 18baccording to the third preferred embodiment of the present invention. The noise reduction circuit 18b of FIG. 4 is characterized by including a canceling signal adding circuit 28 instead of the canceling signal adding circuit 25 as compared with the noise reduction circuit 18 of FIG. 1. In the present preferred embodiment, the canceling signal adding circuit 28 is configured by including transmission lines 28a, 28b, 28c and 28d, and adjusts the attenuation and the phase to the transmitting wireless signal S by changing line lengths and distances between the lines (and preferably the characteristic impedances in addition) of the transmission lines 28c and 28b located between the bypass capacitor 24a and the DC voltage source Vcc, and the transmission lines 28a and 28b located between the impedance matching circuit 23 and the antenna 11.

Referring to FIG. 4, the connection point of the transmission line 24b and the capacitor 24a is connected to the DC voltage source Vcc via the transmission line 28c and the transmission line 28b, and the output terminal of the impedance matching circuit 23 is connected to an output terminal T2 to the antenna 11 via the transmission line 28d and the transmission line 28a. In this case, the coupler 28A is configured by including one pair of the transmission lines 28a and 28b formed in the vicinity of each other so as to be electromagnetically coupled to each other. Mainly the attenuation amount of the transmission signal S is adjusted by the distance between the lines and the length of paralleled lines of the transmission lines 28a and 28b. In addition, the transmission line 28c is a transmission line for phase adjustment, and the line length and the characteristic impedance of the transmission line 28c are adjusted so that phases are mutually canceled. Namely, in the present preferred embodiment, the canceling signal adding circuit 28 is configured by using the transmission lines 28a and 28d located between the impedance matching circuit 23 and the antenna 11 together with the impedance matching circuit 23 and the transmission lines 28b and 28c, without providing an independent circuit for acquiring a part of the transmitting wireless signal S.

In the canceling signal adding circuit 28 configured as above, the leakage signal N is canceled by a part of the transmitting wireless signal S, and not transmitted to the DC voltage source Vcc side. In addition, in a manner similar to the above described preferred embodiments, a signal for canceling the leakage signal N can be easily added to the transmission line 28b on the power supply line circuit 24 side by the passive circuit. In addition, no additional power consumption of an amplifier and the like is required for canceling the leakage signal N, and the canceling of the leakage signal N can be achieved extremely simply by the passive circuit. Further, it becomes possible to supply a power for canceling the leakage signal N by using a part of the transmitting wireless signal S. In this case, such a mechanism is kept for suppressing the power of the leakage signal N generated by the transmitting wireless signal S leaking to the power supply line circuit 24 by the power supply line circuit 24. With this arrangement, it becomes possible to design the canceling signal adding circuit 28 with an extremely high degree of freedom.

Fourth Preferred Embodiment

Figure 5:
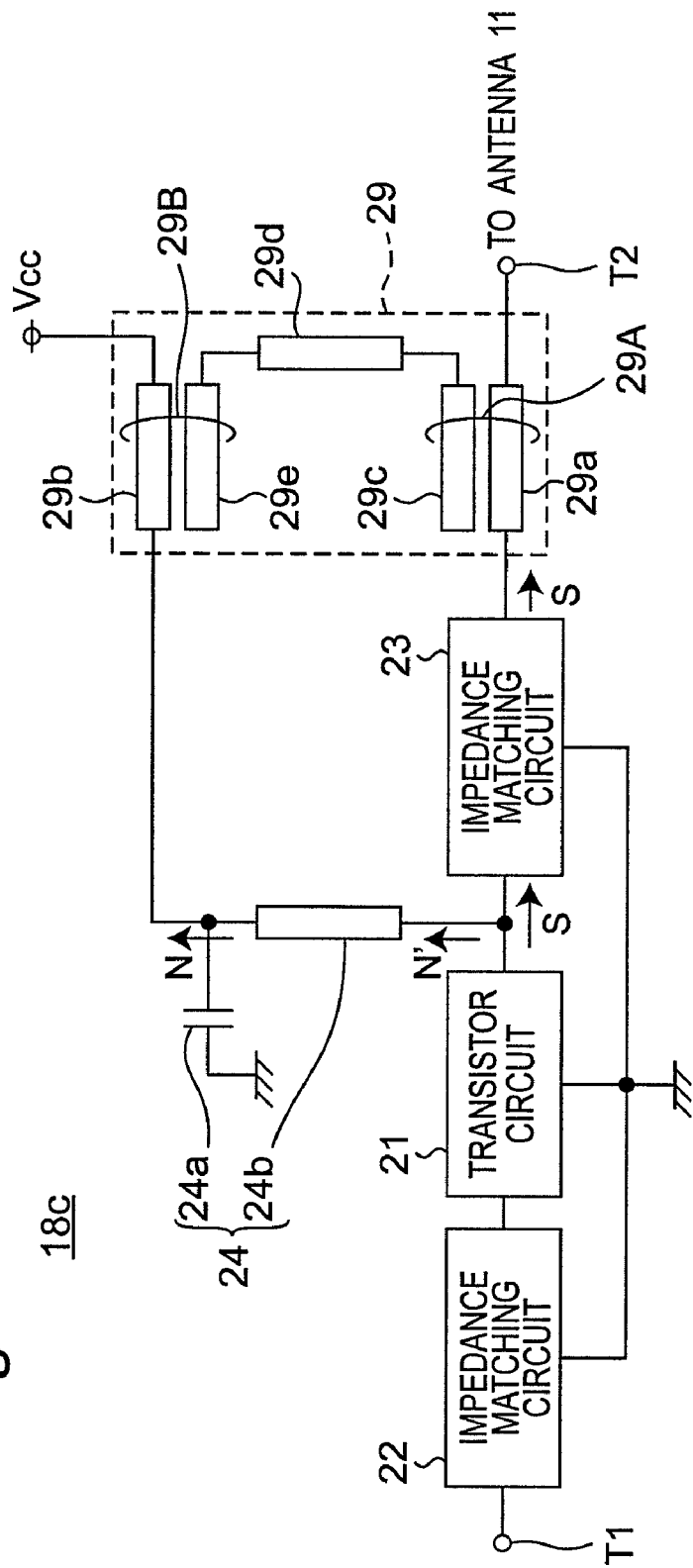
FIG. 5 is a block diagram showing a detailed configuration of a noise reduction circuit 18c according to a fourth preferred embodiment of the present invention.

FIG. 5 is a block diagram showing a detailed configuration of a noise reduction circuit 18c according to the fourth preferred embodiment of the present invention. The noise reduction circuit 18c of FIG. 5 is characterized by including a canceling signal adding circuit 29 instead of the canceling signal adding circuit 25 of FIG. 1. In the present preferred embodiment, the canceling signal adding circuit 29 is configured by including a coupler 29A including one pair of transmission lines 29a and 29c formed in the vicinity of each other so as to be electromagnetically coupled to each other, a transmission line 29d for phase adjustment, and a coupler 29B including one pair of transmission lines 29b and 29e formed in the vicinity of each other so as to be electromagnetically coupled to each other. By adjusting the line lengths and the distances between the lines (and preferably characteristic impedances in addition) of the transmission line 29b located between the bypass capacitor 24a and the DC voltage Vcc, the transmission line 29a located between the impedance matching circuit 23 and the antenna 11, and the transmission lines 29c, 29d and 29e formed among them, the attenuation and the phase to the transmitting wireless signal S are adjusted.

Referring to FIG. 5, by acquiring a part of the transmitting wireless signal S by the transmission line 29c of the coupler 29A, transmitting the partial signal to the transmission line 29e of the coupler 29B via the transmission line 29d for phase adjustment, and adjusting phase and amplitude thereof, the leakage signal N transmitted via the transmission line 29b connected to the power supply line circuit 24 is canceled by the acquired signal which is a part of the transmitting wireless signal S and not transmitted to the DC voltage source Vcc side.

Also in the present preferred embodiment, in a manner similar to each of those of the above described preferred embodiments, the signal for canceling the leakage signal N can be easily added to the leakage signal N flowing through the power supply line circuit 24 by the passive circuit. In addition, no additional power consumption of an amplifier and the like is required for canceling the leakage signal N, and the canceling of the leakage signal N can be achieved extremely simply by the passive circuit. Further, it is possible to further supply electric power for canceling the leakage signal. In this case, such a mechanism is kept for suppressing the leakage of the leakage signal N to the power supply line circuit 24 by the power supply line circuit 24 including the bypass capacitor 24a and the transmission line 24b having a line length of a quarter wavelength. Further, with this arrangement, it becomes possible to design the canceling signal adding circuit 28 with an extremely high degree of freedom.

Figure 6:
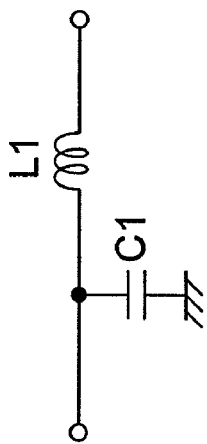
FIG. 6 is a circuit diagram showing a detailed configuration of one example of transmission lines 28c and 29d for phase adjustment of FIG. 4.

FIG. 6 is a circuit diagram showing a detailed configuration of one example of the transmission lines 28c and 29d for phase adjustment of FIG. 4. As shown in FIG. 6, each of the transmission lines 28c and 29d for phase adjustment is, for example, an L-type circuit of a capacitor C1 and an inductor L1. The line length including an amount of phase shift, the amplitude and the characteristic impedance can be adjusted by adjusting the values of the capacitor C1 and the inductor L1. Simulation results of the electrical characteristics of the transmission lines 28c and 29d for phase adjustment will be described in detail later. In addition, the transmission line 29d may be a series circuit of the capacitor C1 and the inductor L1 or a circuit including a resistor.

EXAMPLES OF APPLICATION TO PRINTED CIRCUIT BOARD

As can be seen, each of the preferred embodiments of the present invention can be realized by of a variety of circuits as described above. Each of the canceling signal adding circuits 26 to 29 may be realized by a printed circuit board (of a dielectric substrate) 110 on which a signal amplifier IC 125 is mounted or inside the signal amplifier IC 125. A variety of embodiments can be adopted, and they are described in detail below.

Figure 7:
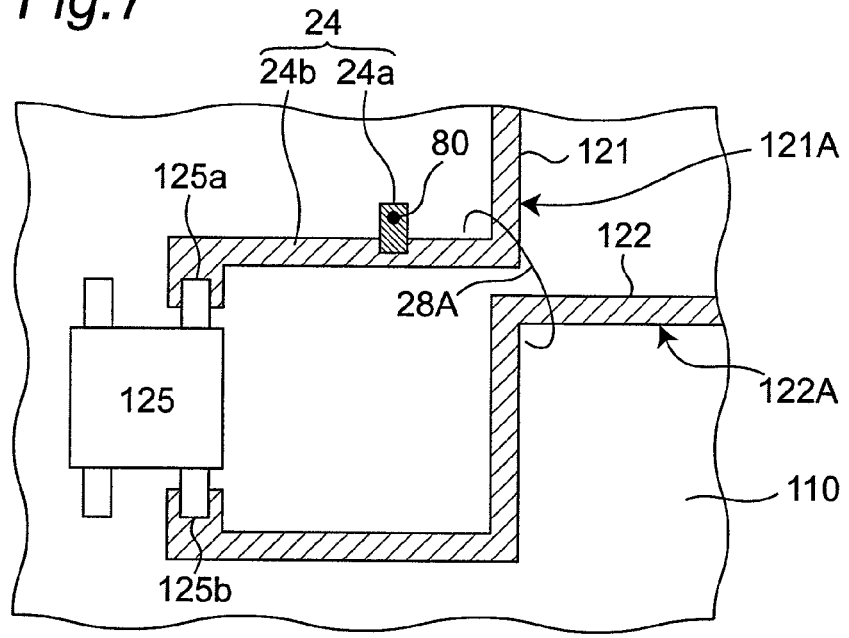
FIG. 7 is a plan view showing a first application example when the noise reduction circuit 18c of FIG. 4 is applied to a printed circuit board 110.

FIG. 7 is a plan view showing a first application example in which the noise reduction circuit 18c of FIG. 4 is applied to a printed circuit board 110. Namely, FIG. 7 illustrates the signal amplifier IC 125 mounted on the printed circuit board 110 and peripheral circuits thereof. Strip conductors 121 and 122 on the printed circuit board 110 connected to a power terminal 125a and an output terminal 125b of the signal amplifier IC 125, respectively, are shown in FIG. 7. In this case, a microstrip line 121A is configured by the strip conductor 121 and a ground conductor 111 (See FIG. 9) formed on the back surface of the printed circuit board 110, and a microstrip line 122A is configured by the strip conductor 122 and the ground conductor 111 (See FIG. 9) formed on a back surface of the printed circuit board 110.

The signal amplifier IC 125 of FIG. 7 is a circuit part containing the impedance matching circuits 22 and 23 and transistor circuit 21 provided in the noise reduction circuit 18 shown in FIG. 4. The power terminal 125a is connected between the transistor circuit 21 and the impedance matching circuit 23, and the output terminal 125b is connected to the output side of the impedance matching circuit 23. Accordingly, in FIG. 7, the strip conductor 121 includes the transmission line 24b of the power supply line circuit 24 of FIG. 4, and the strip conductor 122 corresponds to the line conductor located between the antenna 11 and the impedance matching circuit 23. The bypass capacitor 24a is connected to a part of the strip conductor 121. The strip conductor 121 located between the bypass capacitor 24a and the output terminal of the transistor circuit 21, the wiring conductor of the signal amplifier IC 125 and the power terminal 125a correspond to the transmission line 24b. It is noted that another end of the bypass capacitor 24a is connected to the ground conductor 111 via a through hole conductor 80 filled in a through hole that penetrates the printed circuit board 110 in the thickness direction thereof, by which another end of the bypass capacitor 24a is grounded. Accordingly, in the application example of FIG. 7, the coupler 28A is configured by the strip conductors 121 and 122 that are partly formed in the vicinity of each other so as to be electromagnetically coupled to each other, with adjusting the line length, shape and so on of the strip conductor 122 connected to the output terminal 125b. In the coupler 28A, the leakage signal N transmitted via the strip conductor 121 is canceled by the signal which is a part of the transmitting wireless signal S transmitted though the strip conductor 122.

According to the first application example configured as described above, the leakage signal N can be easily canceled even when the leakage signal N leaking from the signal amplifier IC 125 to the power supply line circuit 24 side cannot be ignored on the printed circuit board 110 on which the arbitrary signal amplifier IC 125 is mounted.

Figure 8:
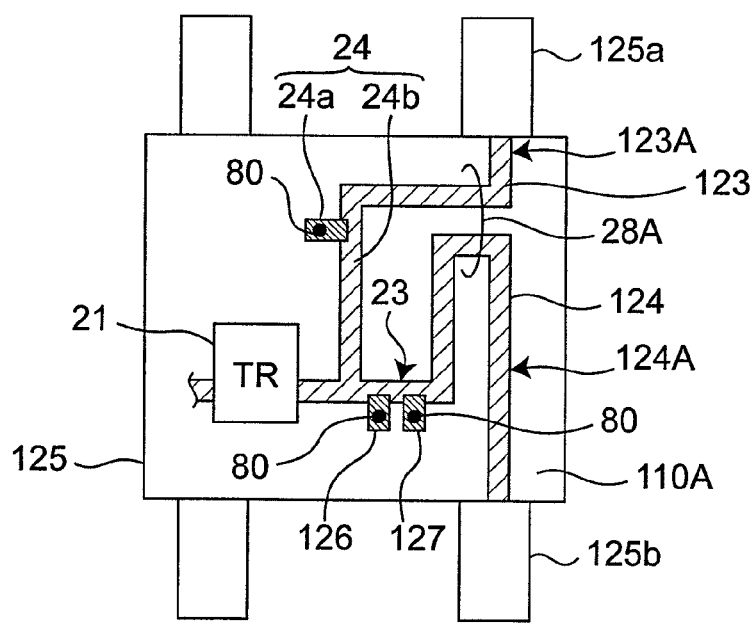
FIG. 8 is a plan view showing a second application example when the noise reduction circuit 18c of FIG. 4 is applied to a signal amplifier integrated circuit (referred to as a signal amplifier IC hereinafter) 125.

FIG. 8 is a plan view showing a second application example when the noise reduction circuit 18c of FIG. 4 is applied to the signal amplifier IC 125. As shown in FIG. 8, it is also possible to cancel the leakage signal N in the signal amplifier IC 125 so that the noise does not leak from the signal amplifier IC 125. Namely, the signal amplifier IC 125 has the power terminal 125a and the output terminal 125b, and the signal amplifier IC 125 contains a circuit corresponding to the impedance matching circuits 22 and 23, the transistor circuit 21, the bypass capacitor 24a, the transmission line 24b and the canceling signal adding circuit 25 shown in the noise reduction circuit 18 of FIG. 4.

On the semiconductor substrate of the signal amplifier IC 125 of FIG. 8, a strip conductor 123 including the transmission line 24b and the transmission line of the coupler 28A is formed between the transistor circuit 21 and the power terminal 125a, and a strip conductor 124 including the impedance matching circuit 23 and the transmission line of the coupler 28A is formed between the transistor circuit 21 and the output terminal 125b. In this case, a microstrip line 123A is configured by the strip conductor 123 and the ground conductor (not shown, and corresponding to the ground conductor 110 of FIG. 9, etc.) formed on a back surface of a semiconductor substrate 110A. A microstrip line 124A is configured by the strip conductor 124 and the ground conductor (not shown, and corresponding to the ground conductor 110 of FIG. 9, etc.) formed on the back surface of the semiconductor substrate 110A. One end of the bypass capacitor 24a is connected to a part of the strip conductor 123, and another end thereof is connected to the ground conductor via the through hole conductor 80 filled in the through hole that penetrates the semiconductor substrate 110A in the thickness direction, by which another end of the bypass capacitor 24a is grounded. The impedance matching circuit 23 is configured by a part of the strip conductor 124, and capacitors 126 and 127 each of whose one end is grounded via the through hole conductor 80. In this case, the canceling signal adding circuit 28 is configured by including the impedance matching circuit 23, the strip conductor 124, the strip conductor 123, and the coupler 28A in which the two strip conductors 123 and 124 are formed in the vicinity of each other so as to be electromagnetically coupled to each other.

It is noted that the impedance matching circuit 22 is not shown in FIG. 8. In this case, the leakage signal N is substantially canceled by adding a part of the transmitting wireless signal S to the leakage signal N by the coupler 28A, by adjusting the line length, the shape and so on of the strip conductor 124. According to the above configuration, the leakage signal N can be prevented from leaking from the power terminal 125a of the signal amplifier IC 125 to an external circuit.

In addition, the noise reduction circuit according to the present invention may be configured by including circuit elements different from the circuit elements described in the above preferred embodiments. For example, the transmission line 24b may be configured by the strip conductors 121 and 122, however, a circuit of high impedance at the frequency of the transmitting wireless signal S may be configured by connecting a circuit including a choke coil and a bypass capacitor to the output terminal of the transistor circuit 21. Further, it is possible to configure the above passive circuit of a variety of types of circuit elements besides the wiring patterns of the strip conductors 121 to 124 and so on, and combinations of various types of elements of coils, capacitors and resistors can be adopted.

Although the signal amplifier IC 125 is employed in the application examples of FIGS. 7 and 8, the present invention is not limited to this, and a signal amplifier may be configured by employing a field-effect transistor without forming the signal amplifier in the IC.

Further, the examples has been described in the foregoing examples in which the power supply line circuit 24 and the canceling signal adding circuit 25 are provided in the same layer on the printed circuit board 110 or the semiconductor substrate 110A, however, these circuits may be formed in different layers. Namely, the power supply line circuit 24 and the canceling signal adding circuit 25 may be formed in different layers, respectively, so long as the power can be transmitted from the strip conductor 121 or 123 provided between the impedance matching circuit 23 and the antenna 11, to the wiring of the strip conductor or the like provided between the bypass capacitor 24a and the DC voltage source Vcc, by the canceling signal adding circuit 25. A variety of configurations can be adopted. Of course, either one or both of the power supply line circuit 24 and the canceling signal adding circuit 25 may be formed in a plurality of layers via the through hole conductor 80. Implemental examples of the coupler 28A are particularly described in detail below.

Figure 9:
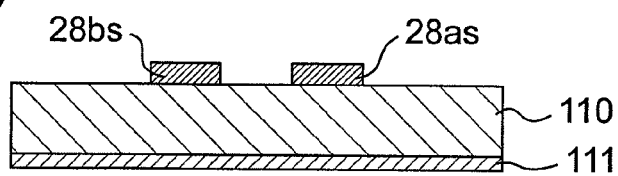
FIG. 9 is a longitudinal sectional view showing an implemental example of FIG. 7 when a coupler 28A of FIG. 4 is applied to the printed circuit board 110.

FIG. 9 is a longitudinal sectional view showing an implemental example of FIG. 7 when the coupler 28A of FIG. 4 is applied to the printed circuit board 110. Referring to FIG. 9, strip conductors 28as and 28bs of one pair of transmission lines of the coupler 28A are formed in the vicinity of each other on the printed circuit board 110 so as to be paralleled and electromagnetically coupled to each other. The ground conductor 111 is formed on the printed circuit board 110. The coupler 28A is configured by the above configuration.

Figure 10:
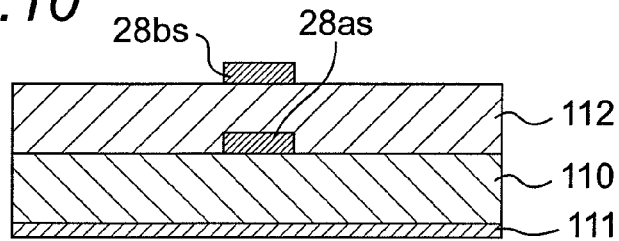
FIG. 10 is a longitudinal sectional view showing a first modified preferred embodiment when the coupler 28A of FIG. 4 is applied to the printed circuit board 110.

FIG. 10 is a longitudinal sectional view showing a first modified preferred embodiment when the coupler 28A of FIG. 4 is applied to the printed circuit board 110. Referring to FIG. 10, the strip conductors 28as and 28bs of one pair of transmission lines are formed in the vicinity of each other so as to be electromagnetically coupled to each other on the printed circuit board 110, on the back surface of which the ground conductor 111 is formed. The strip conductor 28as is formed on the front surface of the printed circuit board 110, a dielectric layer 112 is formed on the strip conductor 28as, and the strip conductor 28bs is formed on the dielectric layer 112 at a position just above the strip conductor 28as. The coupler 28A is configured by the above configuration.

Figure 11:
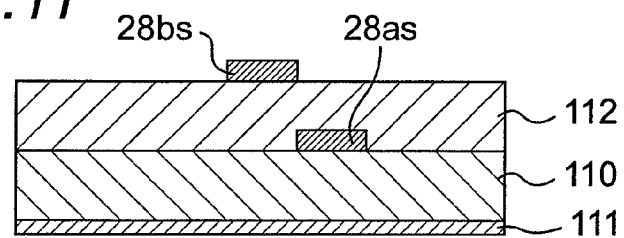
FIG. 11 is a longitudinal sectional view showing a second modified preferred embodiment when the coupler 28A of FIG. 4 is applied to the printed circuit board 110.

FIG. 11 is a longitudinal sectional view showing a second modified preferred embodiment when the coupler 28A of FIG. 4 is applied to the printed circuit board 110. As compared with the first modified preferred embodiment of FIG. 10, the strip conductor 28bs is formed on the dielectric layer 112 at a position shifted from the position just above the strip conductor 28as in the second modified preferred embodiment of FIG. 11. The coupler 28A is configured by the above configuration.

Figure 12:
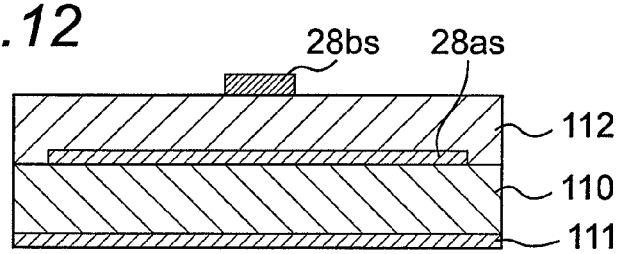
FIG. 12 is a longitudinal sectional view showing a third modified preferred embodiment when the coupler 28A of FIG. 4 is applied to the printed circuit board 110.

FIG. 12 is a longitudinal sectional view showing a third modified preferred embodiment when the coupler 28A of FIG. 4 is applied to the printed circuit board 110. As compared with the first modified preferred embodiment of FIG. 10, one pair of strip conductors 28as and 28bs of the coupler 28A are formed perpendicular to each other in the third modified preferred embodiment of FIG. 12. The coupler 28A is configured by the above configuration.

The two-layer structures are shown in the examples of FIGS. 9 to 12. However, the present invention is not limited to this, and the strip conductors 28*as* and 28*bs* may be formed in arbitrary layers of a structure of three or more layers. In addition, the strip conductors 28*as* and 28*bs* of one pair are not required to be parallel to each other, and are not required to have the line widths the same as each other.

Figure 13:
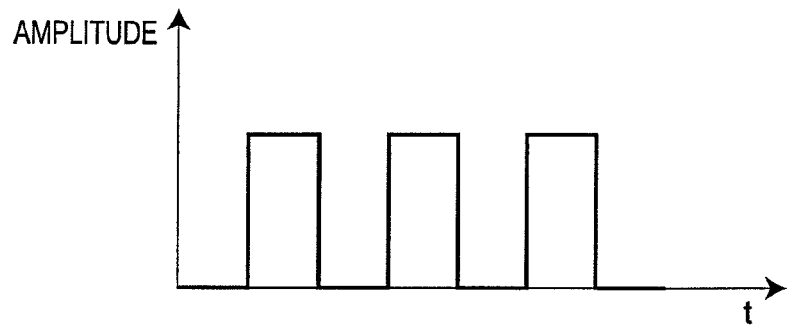
FIG. 13 is a diagram showing a temporal waveform of a square wave clock signal which is an input signal of the noise reduction circuit 18 of FIG. 2.
Figure 14:
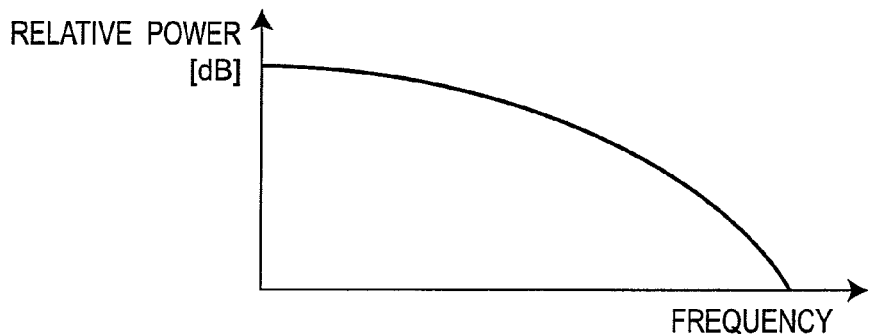
FIG. 14 is a diagram showing a frequency characteristic of frequency components of the square wave clock signal of FIG. 13.

Further, such a case is examined below in which the input signal to the noise reduction circuit 18 of FIG. 2 is a clock signal of a square wave. FIG. 13 is a diagram showing a temporal waveform of the clock signal of the square wave which is an input signal of the noise reduction circuit 18 of FIG. 2. FIG. 14 is a diagram showing a frequency characteristic of frequency components of the clock signal of the square wave of FIG. 13. When the input signal to the noise reduction circuit 18 of FIG. 2 is the clock signal of the square wave as shown in FIG. 13, the clock signal includes higher harmonic components and has frequency components in a relatively wide frequency band as shown in FIG. 14. In such a place where the frequency band of the communication system and the higher harmonic components of the clock signal overlap, the clock signal possibly exerts influences of interference or the like on the circuit (particularly the receiver circuit) of the communication system in the frequency band of the wireless signal and the frequency bands related to the frequency band of the wireless signal, such as the frequency band of an intermediate frequency signal of an intermediate frequency acquired after frequency conversion to lower frequency and the frequency band of the baseband signal. In particular, when a receiving frequency band and the higher harmonic components of the clock signal overlap, it becomes impossible to correctly restore a signal having a weak receiving signal power and to perform a call in the case of, for example, a mobile telephone. All of the higher harmonic components leak to the bias circuit side when the clock signal is amplified, however, by using the noise reduction circuits 18, 18*a*, 18*b* and 18*c* of the present preferred embodiment, such an advantageous effect can be exhibited that the leakage signal N can be remarkably reduced only in the frequency bands that influence the communication system (because the power supply line circuit 24 operates as a filter circuit that removes only the predetermined frequency bands or passes therethrough components of only the other predetermined frequency bands as described above). In this case, for example, the transistor circuit 21 is a circuit such as a mixer provided in the wireless receiver circuit 13 of the wireless communication apparatus. Further, the application examples described above with reference to FIGS. 13 and 1 can be also applied to, for example, a digital circuit.

IMPLEMENTAL EXAMPLE

Figure 15:
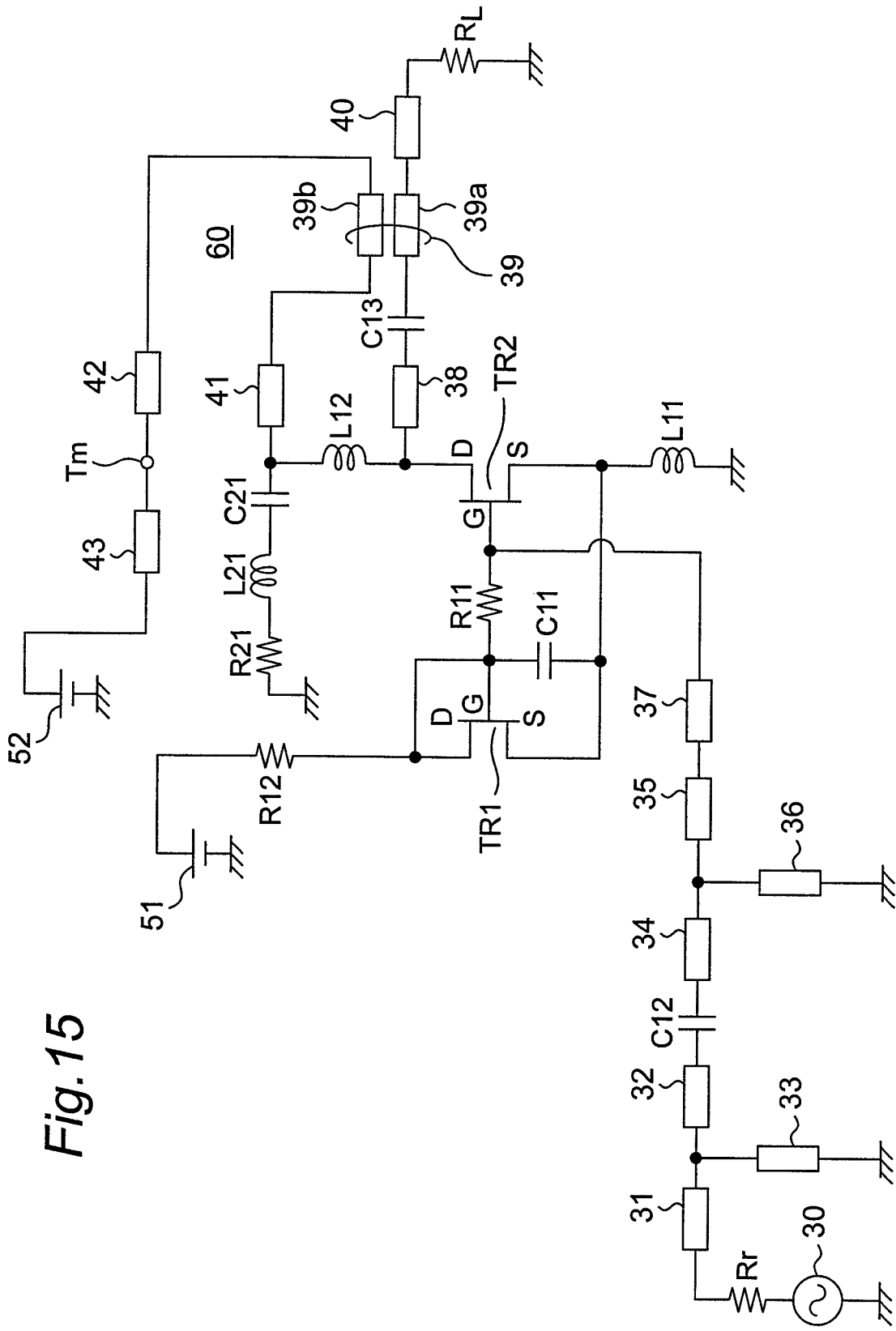
FIG. 15 is a circuit diagram of a simulation circuit which is used for a simulation conducted by the present inventors and substantially corresponds to the noise reduction circuit 18c of FIG. 5.

FIG. 15 is a circuit diagram of a simulation circuit which is used for a simulation conducted by the present inventors and substantially corresponds to the noise reduction circuit 18*c* of FIG. 5. Referring to FIG. 15, the simulation circuit is realized by a harmonic balance analysis method by using a simulator ADS (Advanced Design System) produced by Agilent Technologies, and the simulation circuit is configured by including a reference high-frequency signal generator 30 including an internal output resistance Rr, transmission lines 31 to 38, 39*a*, 39*b* and 40 to 43, field-effect transistors TR1 and TR2, resistors R11 and R21, capacitors C11 to C13 and C21, inductors L11 and L21, DC voltage sources 51 and 52, and a load resistance $R_L$. In this case, a coupler 39 is configured by one pair of transmission lines 39*a* and 39*b*, and a canceling signal adding circuit 60 is configured by a transmission line 38, a capacitor C13 and a coupler 39. In the simulation circuit configured as above, a voltage waveform of a bias voltage was measured at a monitoring point Tm which is a connection point of transmission lines 42 and 43.

Figure 16:
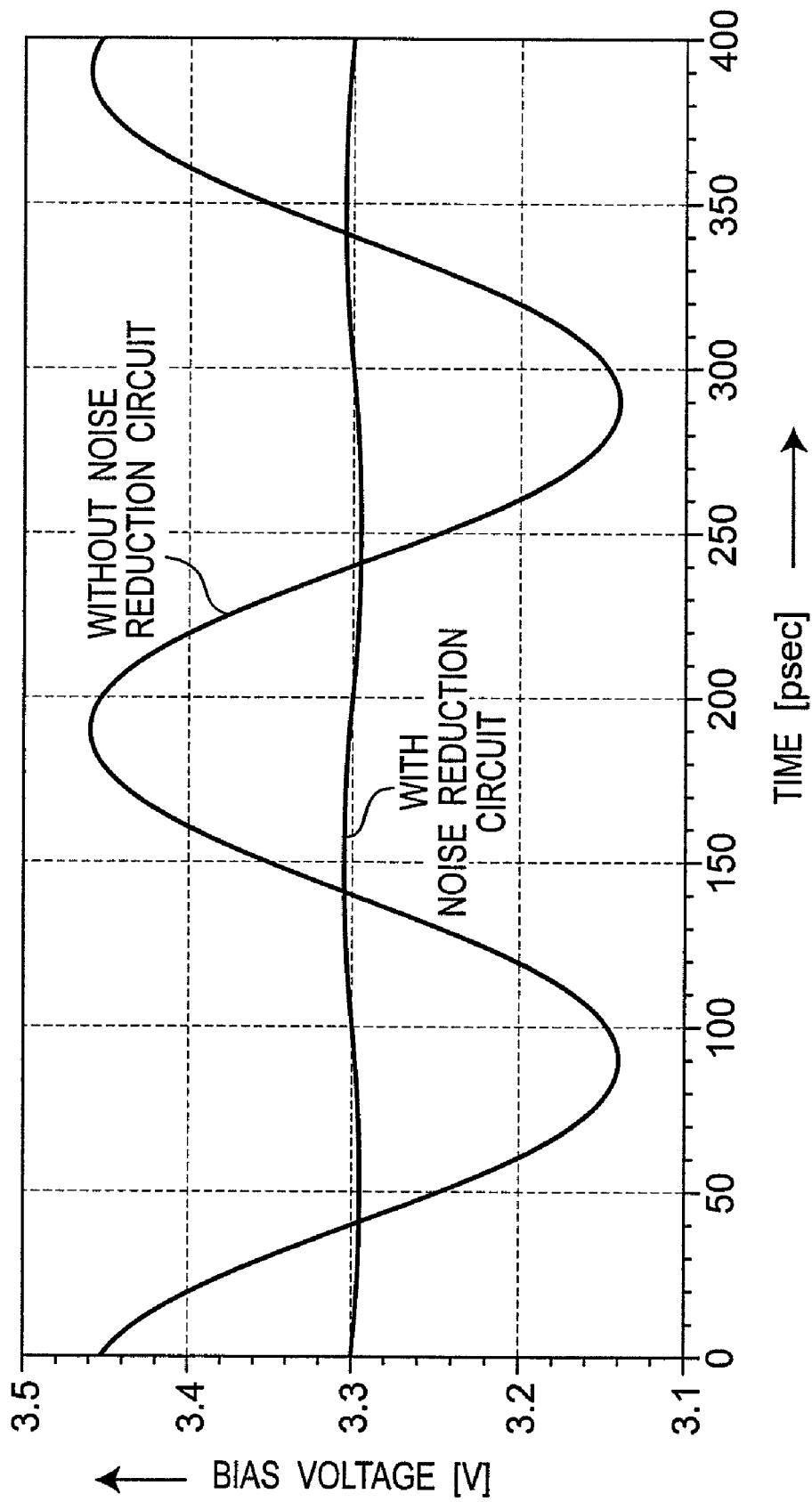
FIG. 16 is a waveform diagram of the simulation results of FIG. 15, showing temporal waveforms of a bias voltage with or without the noise reduction circuit for confirming a noise reduction effect.

FIG. 16 is a waveform diagram of the simulation results of FIG. 15, showing temporal waveforms of a bias voltage with or without the noise reduction circuit for confirming a noise reduction effect. As apparent from FIG. 16, it can be understood that the leakage signal N superimposed on the bias voltage is recognized when no noise reduction circuit 60 is provided, and the leakage signal N is remarkably reduced when the noise reduction circuit 60 is provided.

Figure 17:
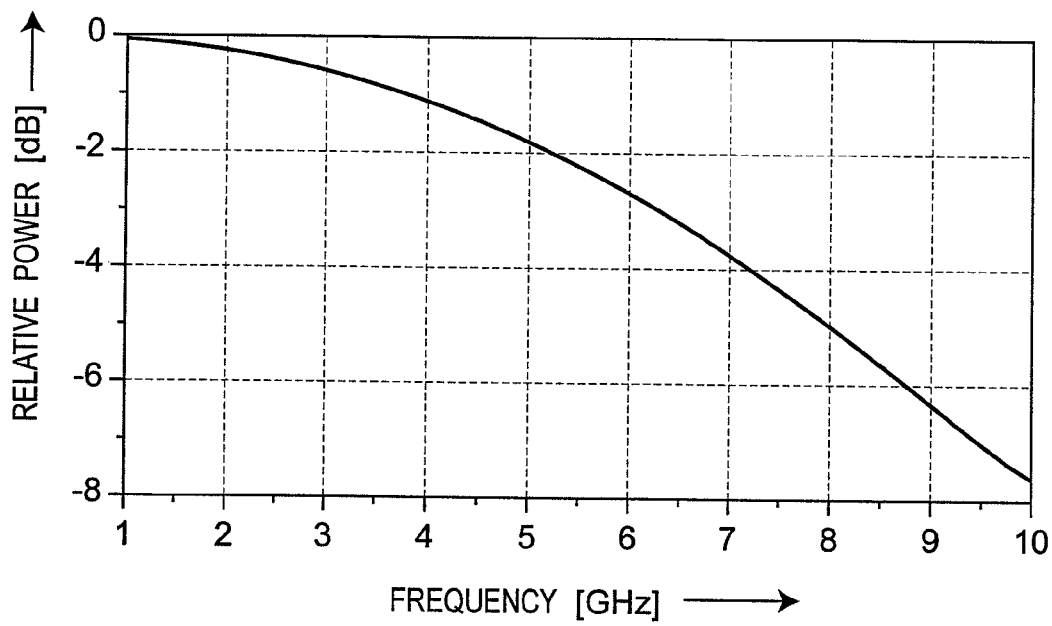
FIG. 17 is a graph showing a frequency characteristic of a relative electric power of a transmission coefficient in the transmission lines 28c and 29d for phase adjustment of FIG. 6.
Figure 18:
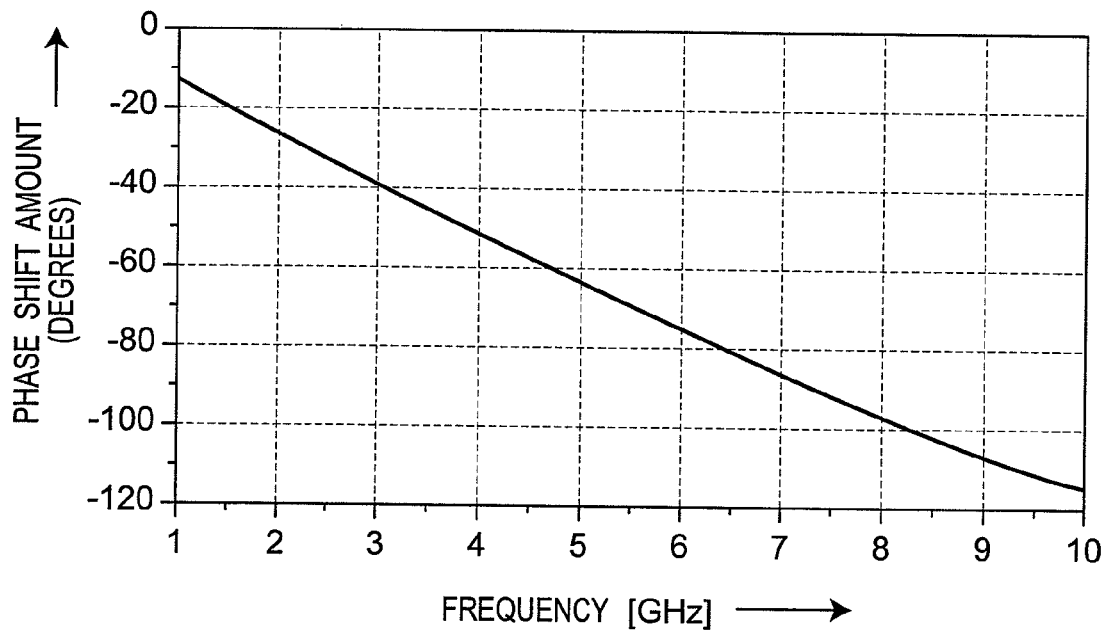
FIG. 18 is a graph showing the frequency characteristic of the phase of the transmission coefficient in the transmission lines 28c and 29d for phase adjustment of FIG. 6.

FIG. 17 is a graph showing a frequency characteristic of a relative electric power of a transmission coefficient in the transmission lines 28*c* and 29*d* for phase adjustment of FIG. 6, and FIG. 18 is a graph showing the frequency characteristic of the phase of the transmission coefficient in the transmission lines 28*c* and 29*d* for phase adjustment of FIG. 6. As apparent from FIGS. 17 and 18, it can be understood that it is possible to change the passing power and the phase shift amount depending on frequencies.

SUMMARY OF PREFERRED EMBODIMENTS OF THE PRESENT INVENTION

According to the present invention, the noise is suppressed by attenuating a part of an output signal amplified by the signal amplifying means when the output signal leaks to the power supply line circuit, and adding to the leaking output signal a signal having a phase substantially opposite to a phase of the leaking output signal and having an amplitude substantially the same as an amplitude of the leaking output signal. Namely, the noise to be suppressed is the signal which is the output signal amplified by the signal amplifier leaking to the power supply line circuit, and which is a weak signal. On the other hand, the signal generated by the signal adding means is generated from a part of the output signal amplified by the signal amplifying means, and the amplified output signal is the signal that has a large electric power.

Accordingly, the signal adding means of the present invention does not need any amplifier circuit in order to generate the signal having a phase substantially opposite to a phase of the leaking output signal and having an amplitude substantially the same as an amplitude of the leaking output signal, and the signal can be generated by attenuating the output signal. As a result, it is possible to provide a circuit for canceling the output signal leaking to the power supply line circuit without any power consumption. In addition, no part is required for forming the amplifier circuit or the like in order to generate the signal having a phase substantially opposite to a phase of the leaking output signal and having an amplitude substantially the same as an amplitude of the leaking output signal, and the signal adding means can be provided without preventing the size reduction of the circuit.

In this case, the signal amplifying means is only required to be a circuit that amplifies the input signal to acquire the output signal, and operates to amplify the input signal by utilizing the power supplied via the power supply line circuit. Of course, it is possible to properly perform impedance matching or to insert a filter in each line connected to the signal amplifying means.

In addition, the signal leaking to the power supply line circuit is suppressed when acquiring the output signal by amplifying the input signal in the present invention. Accordingly, when such an amplifying means is set to the object for application to the present invention that a signal thereof leaks to the power supply line, the effect is remarkably produced. An amplifying means for a high frequency signal (e.g., signal of a frequency of equal to or higher than 30 MHz) becomes an example of an object for application to the present invention. Accordingly, the current mobile telephones utilizing a band from 800 MHz to 2 GHz, the current wireless LANs utilizing a 2 GHz band and a 5 GHz band, and so on are preferred objects for application to the present invention.

In addition, a part of the output signal from the signal amplifying means is acquired by the signal adding means. Namely, the output signal leaking from the signal amplifying means is canceled by using the output signal amplified by the signal amplifying means in the present invention. However, in the amplifying means, the former signal is the output signal to be acquired by amplification, and the latter signal is an unnecessary noise. Accordingly, the former signal is substantially much larger than the latter signal. Accordingly, the signal adding means can acquire a signal that can sufficiently cancel the leaking signal only by acquiring a part of the output signal from the signal amplifying means.

In addition, a variety of configurations can be adopted in order to acquire a part of the output signal, and the wirings for electrical conduction with the wiring for transmitting the output signal are not always essential. Namely, in such a case where the output signal is a high frequency signal, when a circuit which is a part of the signal adding means is wired in the vicinity of the transmission line for transmitting the output signal, the output signal leaks to the circuit which is a part of the signal adding means. Accordingly, such a configuration may be adopted in which a part of the output signal is acquired by a wiring whose electrical conduction to the output line of the signal amplifying means is not established. According to this configuration, a signal for canceling the output signal leaking to the power supply line circuit can be generated without excessively preventing the output power of the signal amplifying means.

In addition, the signal adding means is only required to attenuate the output signal from the signal amplifying means. The signal adding means may have such a configuration in which a part of the output signal is acquired and attenuated by the acquiring simultaneously as described above, or such a configuration in which a part of the output signal is acquired and the acquired signal whose electric power is attenuated is further attenuated. Since the signal attenuation as described above can be performed without any supply of power from the power source, the attenuation can be achieved with an extremely simple configuration.

Further, the signal generated by the signal adding means is only required to have a phase substantially opposite to a phase of the output signal leaking to the power supply line circuit and have an amplitude substantially the same as an amplitude of the output leaking signal. Namely, it is only required that the signal for canceling the output signal leaking to the power supply line circuit can be generated. Of course, a signal having a phase correctly opposite to the phase of the output signal leaking to the power supply line circuit and having an amplitude correctly the same as the amplitude of the output leaking signal can cancel the output leaking signal. However, when it is difficult to correctly specify the phase and the amplitude of the leaking signal, it is only required that the leaking signal can at least be at least attenuated by adding a signal in the signal adding means.

In this sense, it is only required that a signal having a phase substantially opposite to the phase the output signal leaking to the power supply line circuit and having an amplitude substantially the same as the amplitude of the output leaking signal can be generated in the signal adding means. For example, it is proper to provide such a configuration that the signal having a phase substantially opposite to the phase the output signal leaking to the power supply line circuit and having an amplitude substantially the same as the amplitude of the output leaking signal is generated by practically selectable wirings, parts and so on.

In addition, it is sometimes the case where the output signal has a predetermined frequency band. Accordingly, it is acceptable to provide a configuration such that the signal adding means selects a signal of the frequency desired to be suppressed most, such as a signal of the greatest amplitude or the highest transmission efficiency within the frequency band of the output signal leaking to the power supply line circuit, and adds a signal having a phase substantially opposite to a phase of the selected signal and having an amplitude substantially the same as an amplitude of the selected signal.

In the present invention, the output signal leaking to the power supply line circuit is a part of the signal amplified by the signal amplifying means, and substantially coincides with a frequency band of the amplified signal. Accordingly, by canceling the output signal leaking to the power supply line circuit by a part of the amplified signal, the leakage signal can be attenuated extremely easily within the entire frequency band of the output signal leaking to the power supply line circuit.

Further, the signal adding means in the present invention may be configured by a passive circuit. Namely, the passive circuit is a component of a circuit such as a resistor, a capacitor or a coil, which has no amplification effect. Each of these components transmits a signal with effecting attenuation and phase change on the signal. However, since it is required to generate the signal leaking to the power supply line circuit by attenuating a part of the output signal having a large power in the present invention, the signal can be easily generated by a passive circuit. In addition, because the passive circuit is utilized, power supply from the power source is quite unnecessary for generating the signal. Further, since it is possible to realize the signal adding means by the simple components, the apparatus can be easily reduced in size.

As described above, as an example in which the signal adding means is configured by the passive circuit, such an example may be adopted in which the signal adding means is configured by only wirings. Namely, it is possible to adjust the phase and the amplitude of the output signal by adjusting the length and the shape of the lines, the distance between lines formed in the vicinity of each other, the length of paralleled lines and so on. Accordingly, it is possible to provide such a configuration that the leaking output signal is canceled, by acquiring a part of the output signal from the signal amplifying means by the wirings, and adding the acquired signal to the power supply line circuit. According to this configuration, the signal adding means can be formed extremely simply.

It is noted that the present invention may be applied to a signal amplifying means adopting a configuration for suppressing the output signal leaking to the power supply line circuit. Namely, the leakage of the output signal can be suppressed by adjusting the impedance with respect to the frequency of the output signal in the power supply line circuit. For example, in the power supply line circuit, a low-impedance part and a high-impedance part are formed. In this case, the ground of the low-impedance part is substantially shorted at a frequency of the output leaking signal, and the high-impedance part substantially open-circuits the power supply line circuit located between the low-impedance part and the signal amplifying means at the frequency of the leaking output signal.

According to the above configuration, the output signal leaking to the power supply line circuit can be suppressed by the high-impedance part and the low-impedance part. However, the leaking output signal cannot be completely made "0" even when such a circuit is configured by actual circuit parts, and a part of the power leaks to the power source side. The influence of such a leakage cannot be ignored in the recent electronic device where reductions in size and power consumption have been promoted.

Accordingly, when the present invention is applied to such a configuration in which the leakage of the output signal is suppressed by the impedances as described above in the power supply line circuit, it is possible to suppress the leakage of the output signal to the power supply line circuit to an extremely small level. At this time, the signal generated by the signal adding means is added at a position closer to the power source side than the low-impedance part. Namely, the signal leakage is prevented by the combination of the low-impedance part and the high-impedance part in the power supply line circuit, and therefore, when the signal by the signal adding means is added at the position closer to the power source side than the low-impedance part, the signal leaking from the low-impedance part to the power source side can be further suppressed with maintaining the mechanism for preventing the signal leakage by the combination of the low-impedance part and the high-impedance part.

It is noted that the low-impedance part and the high-impedance part only required to be configured so as to suppress the signal leaking to the power supply line circuit by the combination of both of them. However, when the low-impedance part and the high-impedance part are configured by actual circuit parts and the like, it is impossible to make the impedance by the low-impedance part "0" and to make the impedance by the high-impedance part infinite. In this sense, it is only required to suppress the leaking signal by making a line for the signal at the frequency of the output signal substantially shorted with the ground in the low-impedance part, and substantially setting the high-impedance part to a open-circuited state for the signal at the frequency of the leaking output signal in the high-impedance part.

As the above configuration, it is possible to configure the low-impedance part by a capacitor passing therethrough a signal having the frequency of the leaking output signal, and it is possible to configure the low-impedance part by providing a transmission line having a length of a quarter of a wavelength of the output leaking signal between the low-impedance part and the signal amplifying means. With this arrangement, the low-impedance part and the high-impedance part can be configured by an extremely simple circuit.

By adding the signal by the signal adding means with maintaining the mechanism to prevent the leakage of the signal by the combination of the low-impedance part and the high-impedance part as described above, the design freedom of the signal adding means can be made extremely high. Namely, when such a configuration is adopted in which the signal is added to the power supply line circuit of the signal amplifying means, the impedance of the power supply line circuit when seen from the signal amplifying means generally fluctuates, and therefore, it is necessary to provide a design conforming to this fluctuation in the signal amplifying means.

However, as described above, in such a configuration that the signal generated in the signal adding means is added at a position closer to the power source side than the low-impedance part, the addition by the signal amplifying means is performed at a position closer to the power source side than the low-impedance part substantially shorted with the ground. Accordingly, the impedance when seen from the signal amplifying means scarcely changes. Accordingly, the circuit configuration in the signal adding means can freely be determined, and a design of an extremely high degree of freedom can be achieved so long as the signal is added to the power source side than the low-impedance part.

Further, the ground is substantially short-circuited at the frequency of the leaking output signal by the low-impedance part. However, since the signal added by the signal adding means is provided by acquiring and attenuating a part of the output signal, the ground is substantially short-circuited by the low-impedance part also at the frequency of the signal added. Accordingly, it is possible to perform the signal canceling without leaking the signal added by the signal adding means to the signal amplifying means side.

Further, the noise reduction apparatus of the present invention can be applied to various signal amplifying means. For example, in such a case where the signal amplifying means is provided as one part and signal adding means is formed on a substrate, when the part is mounted on the substrate, the signal leaking from the part can be suppressed. Accordingly, even when a part that leaks a noise is employed, the noise can be easily suppressed.

Further, it is also possible to provide parts that leak no noise by the present invention. As an example for the purpose, it is acceptable to configure a part having the signal amplifying means and the signal adding means of the present invention and having a power terminal connected to the power supply line circuit and an output terminal for outputting the output signal. Namely, the output signal leaking to the power supply line circuit is canceled inside the part, and the output signal does not leak from the power terminal. Accordingly, the user of the part is able to supply the predetermined power from the power terminal and to acquire the output signal from the output terminal without taking the leakage signal into consideration.

Further, a wireless communication apparatus such as mobile communication apparatus can be adopted as an example of the objects for application to the present invention. Namely, the transmission signal is acquired by the signal amplifying means in mobile communication apparatus, and it is often the case where the transmission signal consumes a large power in the apparatus. In addition, the reductions in size and power consumption have been promoted in recent years in mobile communication apparatus, and it is sometimes the case where the influence of the output signal amplified by the signal amplifying means cannot be ignored. Accordingly, when there is configured the mobile communication apparatus having the signal amplifying means and the signal adding means of the present invention, it is possible to provide mobile communication apparatus of a small size and low power consumption without being affected by the noise.

The case where the present invention is realized as an apparatus in the above description, however, the present invention is also applicable to a method for providing the apparatus. Of course, the substantial operation is similar to that of the apparatus described above. In addition, the concept of the present invention is not limited to this, but includes a variety of forms, as in the case where the noise reduction device as described above is implemented singly, the case where the present invention is applied to a method or the case where the method is utilized as incorporated into other apparatus.

Industrial Applicability

As described in detail above, according to the noise reduction circuit and method of the present invention, by amplifying an input signal and outputting an output signal with supply of power from a power source via a power supply line circuit, and acquiring and attenuating a part of the output signal, a canceling signal is generated that has a phase substantially opposite to a phase of a leakage signal and has an amplitude substantially the same as an amplitude of the leakage signal. In this case, the leaking signal leaks to the power supply line circuit. This leads to a remarkably and effectively reduced noise by a simple configuration and without preventing the reductions in size and power consumption.

The invention claimed is:

1. A noise reduction circuit comprising:
a signal amplifier for amplifying an input signal and outputting an output signal with a supply of power from a power source via a power supply line circuit; and
a signal adding circuit for (i) acquiring and attenuating a part of the output signal from the signal amplifier to generate a canceling signal having a phase substantially opposite to a phase of a leakage signal leaking to the power supply line circuit and having an amplitude substantially the same as an amplitude of the leakage signal, and (ii) substantially canceling the leakage signal by adding the canceling signal to the leakage signal,
wherein the power supply line circuit comprises:
a low-impedance part for substantially shorting a line of the leakage signal with a ground to ground the leakage signal at a frequency of the leakage signal; and
a high-impedance part for setting a connection point between the low-impedance part and the signal amplifier to a substantially open-circuited state at the frequency of the leakage signal, and
wherein the signal adding circuit adds the canceling signal to the leakage signal at a position which is closer to the power source than the low-impedance part.

2. The noise reduction circuit as claimed in claim 1, wherein the signal adding circuit is a passive circuit comprising a plurality of passive elements.

3. The noise reduction circuit as claimed in claim 1, wherein the signal adding circuit adds the canceling signal to the leakage signal by using a coupler comprising one pair of transmission lines formed in the vicinity of each other so as to be electromagnetically coupled to each other.

4. The noise reduction circuit as claimed in claim 1, wherein the high-impedance part is a transmission line having a length of a quarter of a wavelength of the leakage signal, and
wherein the low-impedance part is a capacitor for passing therethrough a signal having the frequency of the leakage signal.

5. The noise reduction circuit as claimed in claim 1, wherein the signal adding circuit is formed on a substrate on which the signal amplifier is mounted.

6. An amplifier comprising a noise reduction circuit, the noise reduction circuit comprising:
a signal amplifier for amplifying an input signal and outputting an output signal with a supply of power from a power source via a power supply line circuit; and
a signal adding circuit for (i) acquiring and attenuating a part of the output signal from the signal amplifier to generate a canceling signal having a phase substantially opposite to a phase of a leakage signal leaking to the power supply line circuit and having an amplitude substantially the same as an amplitude of the leakage signal, and (ii) substantially canceling the leakage signal by adding the canceling signal to the leakage signal,
wherein the power supply line circuit comprises:
a low-impedance part for substantially shorting a line of the leakage signal with a ground to ground the leakage signal at a frequency of the leakage signal; and
a high-impedance part for setting a connection point between the low-impedance part and the signal amplifier to a substantially open-circuited state at the frequency of the leakage signal,
wherein the signal adding circuit adds the canceling signal to the leakage signal at a position which is closer to the power source than the low-impedance part, and
wherein the amplifier further comprises:
a power terminal connected to the power supply line circuit; and
an output terminal for outputting the output signal.

7. A wireless communication apparatus comprising a noise reduction circuit, the noise reduction circuit comprising:
a signal amplifier for amplifying an input signal and outputting an output signal with a supply of power from a power source via a power supply line circuit; and
a signal adding circuit for (i) acquiring and attenuating a part of the output signal from the signal amplifier to generate a canceling signal having a phase substantially opposite to a phase of a leakage signal leaking to the power supply line circuit and having an amplitude substantially the same as an amplitude of the leakage signal, and (ii) substantially canceling the leakage signal by adding the canceling signal to the leakage signal,
wherein the power supply line circuit comprises:
a low-impedance part for substantially shorting a line of the leakage signal with a ground to ground the leakage signal at a frequency of the leakage signal; and
a high-impedance part for setting a connection point between the low-impedance part and the signal amplifier to a substantially open-circuited state at the frequency of the leakage signal,
wherein the signal adding circuit adds the canceling signal to the leakage signal at a position which is closer to the power source than the low-impedance part, and
wherein the wireless communication apparatus further comprises a transmitter for transmitting the signal amplified by the signal amplifier.

8. A wireless communication apparatus comprising a receiver for receiving a wireless signal having a predetermined frequency, and a noise reduction circuit,
wherein the noise reduction circuit comprises:
a signal amplifier for amplifying an input signal and outputting an output signal with a supply of power from a power source via a power supply line circuit; and
a signal adding circuit for (i) acquiring and attenuating a part of the output signal from the signal amplifier to generate a canceling signal having a phase substantially opposite to a phase of a leakage signal leaking to the power supply line circuit and having an amplitude substantially the same as an amplitude of the leakage signal, and (ii) substantially canceling the leakage signal by adding the canceling signal to the leakage signal,
wherein the power supply line circuit comprises:
a low-impedance part for substantially shorting a line of the leakage signal with a ground to ground the leakage signal at a frequency of the leakage signal; and
a high-impedance part for setting a connection point between the low-impedance part and the signal amplifier to a substantially open-circuited state at the frequency of the leakage signal, wherein the signal adding circuit adds the canceling signal to the leakage signal at a position which is closer to the power source than the low-impedance part, wherein the high-impedance part is a transmission line having a length of a quarter of a wavelength of the leakage signal, wherein the low-impedance part is a capacitor for passing therethrough a signal having the frequency of the leakage signal, wherein the input signal is a square wave signal, and wherein the power supply line circuit attenuates a leakage signal, which is a part of frequency components of the square wave signal, at one of (a) a frequency of a wireless signal used in the wireless communication apparatus, (b) an intermediate frequency related to the wireless signal, and (c) a frequency of a baseband signal.

9. A noise reduction method comprising:

amplifying an input signal and outputting an output signal by a signal amplifier with a supply of power from a power source via a power supply line circuit; and acquiring and attenuating a part of the output signal to generate a canceling signal having a phase substantially opposite to a phase of a leakage signal leaking to the power supply line circuit and having an amplitude substantially the same as an amplitude of the leakage signal, wherein the power supply line circuit comprises:
- a low-impedance part for substantially shorting a line of the leakage signal with a ground to ground the leakage signal at a frequency of the leakage signal; and
- a high-impedance part for setting a connection point between the low-impedance part and the signal amplifier to a substantially open-circuited state at the frequency of the leakage signal, and wherein the canceling signal is added to the leakage signal at a position which is closer to the power source than the low-impedance part.

* * * * *